United States Patent
Youngman et al.

(10) Patent No.: US 7,100,273 B2
(45) Date of Patent: Sep. 5, 2006

(54) INTERCONNECT VALIDATION INSTRUMENTS

(75) Inventors: William Dale Youngman, Rocklin, CA (US); Kin Shing Tam, Elk Grove, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 436 days.

(21) Appl. No.: 10/378,241

(22) Filed: Mar. 3, 2003

(65) Prior Publication Data

US 2004/0172816 A1 Sep. 9, 2004

(51) Int. Cl.
*B23P 19/00* (2006.01)

(52) U.S. Cl. .................. 29/759; 324/754; 324/758; 324/761

(58) Field of Classification Search .................. 29/759; 324/754, 758, 761

See application file for complete search history.

(56) References Cited

U.S. PATENT DOCUMENTS

| | | | | |
|---|---|---|---|---|
| 4,535,536 A | * | 8/1985 | Wyss | 29/845 |
| 4,686,465 A | * | 8/1987 | Kruger | 324/754 |
| 4,709,733 A | | 12/1987 | Yakmovitz | |
| 4,774,459 A | * | 9/1988 | Maelzer et al. | 324/754 |
| 4,774,462 A | * | 9/1988 | Black | 324/758 |
| 4,823,079 A | * | 4/1989 | Barth | 324/537 |
| 5,123,457 A | | 6/1992 | Porter | |
| 5,285,149 A | * | 2/1994 | Galdik et al. | 324/761 |
| 5,394,099 A | * | 2/1995 | Kazama | 324/754 |
| 5,767,692 A | * | 6/1998 | Antonello et al. | 324/761 |
| 6,255,834 B1 | * | 7/2001 | Smith | 324/755 |
| 6,407,565 B1 | * | 6/2002 | Sayre et al. | 324/755 |
| 6,414,502 B1 | * | 7/2002 | Sayre et al. | 324/755 |
| 6,469,531 B1 | * | 10/2002 | Sayre et al. | 324/755 |
| 6,784,675 B1 | * | 8/2004 | Willard | 324/754 |

FOREIGN PATENT DOCUMENTS

| | | | |
|---|---|---|---|
| DE | 1800657 B | * | 10/1974 |
| DE | 3312436 A | * | 5/1984 |

* cited by examiner

*Primary Examiner*—Carl J. Arbes

(57) ABSTRACT

Interconnect validation instruments and methods are provided. In one embodiment, an interconnect validation instrument has a shell with an opening at first end thereof and a second end opposite the first end. The second end has a plurality of holes. Each of the plurality of holes is adapted to receive a respective one of a plurality of pins therein. Each of the plurality of holes is further adapted to align the respective one of the plurality of pins when received therein when the respective one of the plurality of pins is not aligned.

19 Claims, 13 Drawing Sheets

INTERCONNECT VALIDATION INSTRUMENTS

FIELD OF THE INVENTION

The present invention relates generally to pin alignment.

BACKGROUND

Pin sets are frequently disposed on circuit boards, such as backplanes, communications boards, or the like, of computer systems, e.g., network servers or the like, for facilitating electrical connections between various electrical components of the computer systems. A cable often connects a pin set at one location of a computer system to a pin set at another location of the computer system. For example, in some applications, a cable is used to connect a pin set on backplane of a server to a pin set on a communications board of the server. For other applications, the processing capability of a server is expanded by using a cable to interconnect a pin set connected to a processor of the server to a pin set connected to another processor of the server.

Pin sets are often disposed on a circuit board so that the pins protrude from a surface of the circuit board. The pins are received in pin-receiving sockets of a cable connector connected to a cable to connect the pin set to the cable. For some applications, a shroud is pressed onto the pins to help align and/or orient the cable connector. Typically, the shroud has a plurality of holes passing therethrough so that when the shroud is pressed onto the pins, each of the pins respectively passes through one of the holes of the shroud.

One problem with connecting cable connectors to pin sets, such as pin sets protruding from circuit boards, is that the pins do not always properly align with the pin-receiving sockets of the cable connector, for example, because one or more pins are bent. In situations where there is misalignment between pins and the respective receiving sockets of the cable connector, forcing the cable connector on the pin set in spite of the misalignment can damage the cable connector. Damage to cable-connectors due to relatively large misalignment is usually substantial and usually results in the immediate replacement of the cable connector and immediate replacement or repair of any misaligned pins. Damage to cable-connectors due to relatively small misalignment is not readily detected and is often manifested in poor contact between the cable connectors and the pins during use, at which time the cable connector is replaced and any misaligned pins are replaced or repaired.

However, the procedure for repairing misaligned pins usually involves visual inspection and applying fingers and/or tools not specifically intended for pin repair, such as screwdrivers, knives, tweezers, or the like, to the misaligned pins. This procedure is frequently ineffective because, for many applications, the alignment tolerances between the pins and the pin connector are small, e.g., because the diameter of the pins and the spacing between adjacent pins are small, as are the diameter of and spacing between the pin-receiving sockets of the cable connector, making it difficult to accurately align the pins and/or to accurately visually verify the alignment of the pins.

In view of the above problem, pin sets are visually inspected prior to connecting cable connectors thereto. However, visual detection of misaligned pins, e.g., due to small alignment tolerances, is often difficult. Moreover, the repair procedure described above is usually used to repair any misaligned pins that can be visually identified.

SUMMARY

One embodiment of the present invention provides an interconnect validation instrument. The interconnect validation instrument has a shell with an opening at first end thereof and a second end opposite the first end. The second end has a plurality of holes. Each of the plurality of holes is adapted to receive a respective one of a plurality of pins therein. Each of the plurality of holes is further adapted to align the respective one of the plurality of pins when received therein when the respective one of the plurality of pins is not aligned.

DETAILED DESCRIPTION

In the following detailed description of the present embodiments, reference is made to the accompanying drawings that form a part hereof, and in which is shown by way of illustration specific embodiments in which the invention may be practiced. These embodiments are described in sufficient detail to enable those skilled in the art to practice the invention, and it is to be understood that other embodiments may be utilized and that process, electrical or mechanical changes may be made without departing from the scope of the present invention. The following detailed description is, therefore, not to be taken in a limiting sense, and the scope of the present invention is defined only by the appended claims and equivalents thereof.

Figure 1:
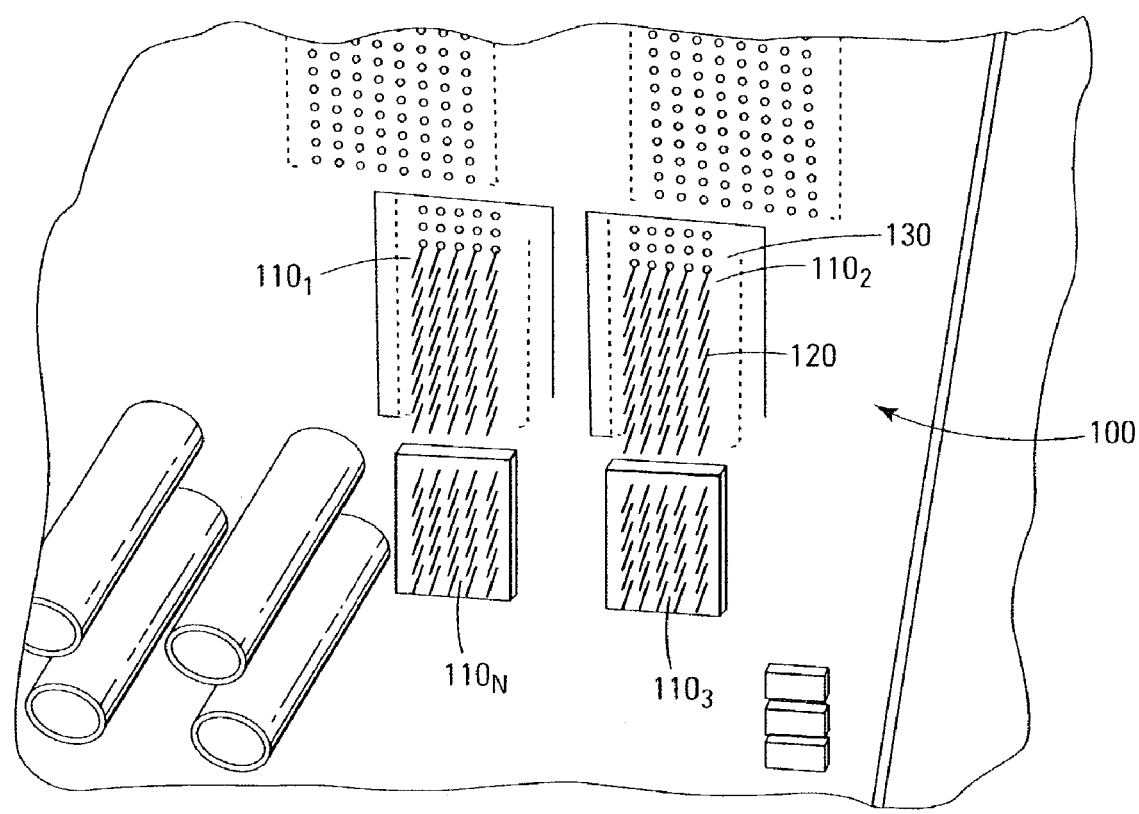
FIG. 1 illustrates a portion of a conventional circuit board.
Figure 2:
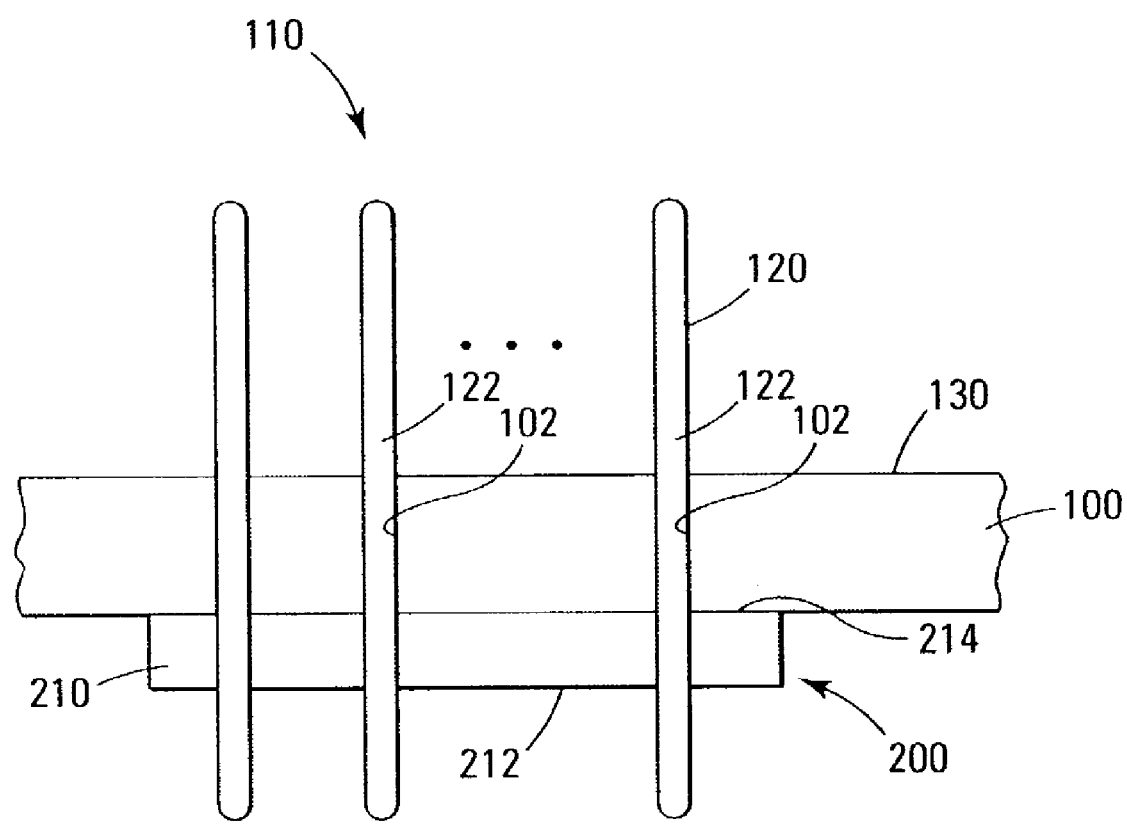
FIG. 2 illustrates a conventional pin connector disposed on the circuit board of FIG. 1.

FIG. 1 illustrates a portion of a circuit board 100, such as a backplane, communications board, or the like of a computer system, e.g., a network server etc. Pin sets $110_1$ to $110_N$ are disposed on circuit board 100. Each of pin sets $110_1$, to $110_N$ includes a plurality of pins 120. Each of pins 120 protrudes from a surface 130 of circuit board 110. For some embodiments, each of pin sets $110_1$, to $110_N$ form part of a connector 200 that includes a base 210, as shown in FIG. 2. Pins 120 pass completely through base 210 and extend from side 212 and 214 of base 210. A portion 122 of pins 120 extends from side 214 of connector 200 and passes through holes 102 that pass completely through circuit board 100 so as to protrude from surface 130 of circuit board 100. Side 214 of connector 200 abuts a surface 132 of circuit board 100 that is located opposite surface 130 of circuit board 100. For one embodiment, connector 200 is available from Amp, a TYCO International Ltd. Company, Inc., Stoney Creek, Alberta, Canada, as part number 646376-1.

Figure 3:
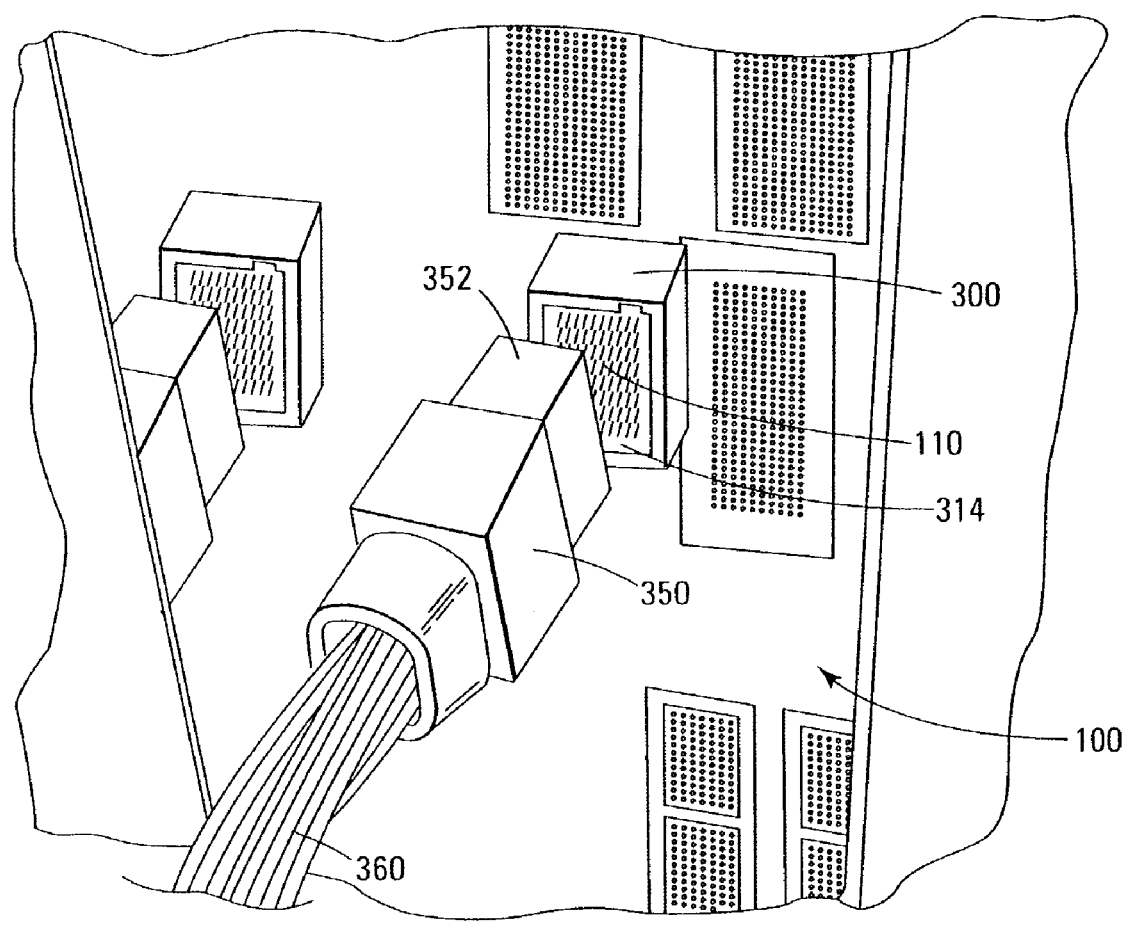
FIGS. 3 and 4 illustrate a shroud disposed around a pin set of the circuit board of FIG. 1 and connecting a conventional cable connector to the pin set.
Figure 4:
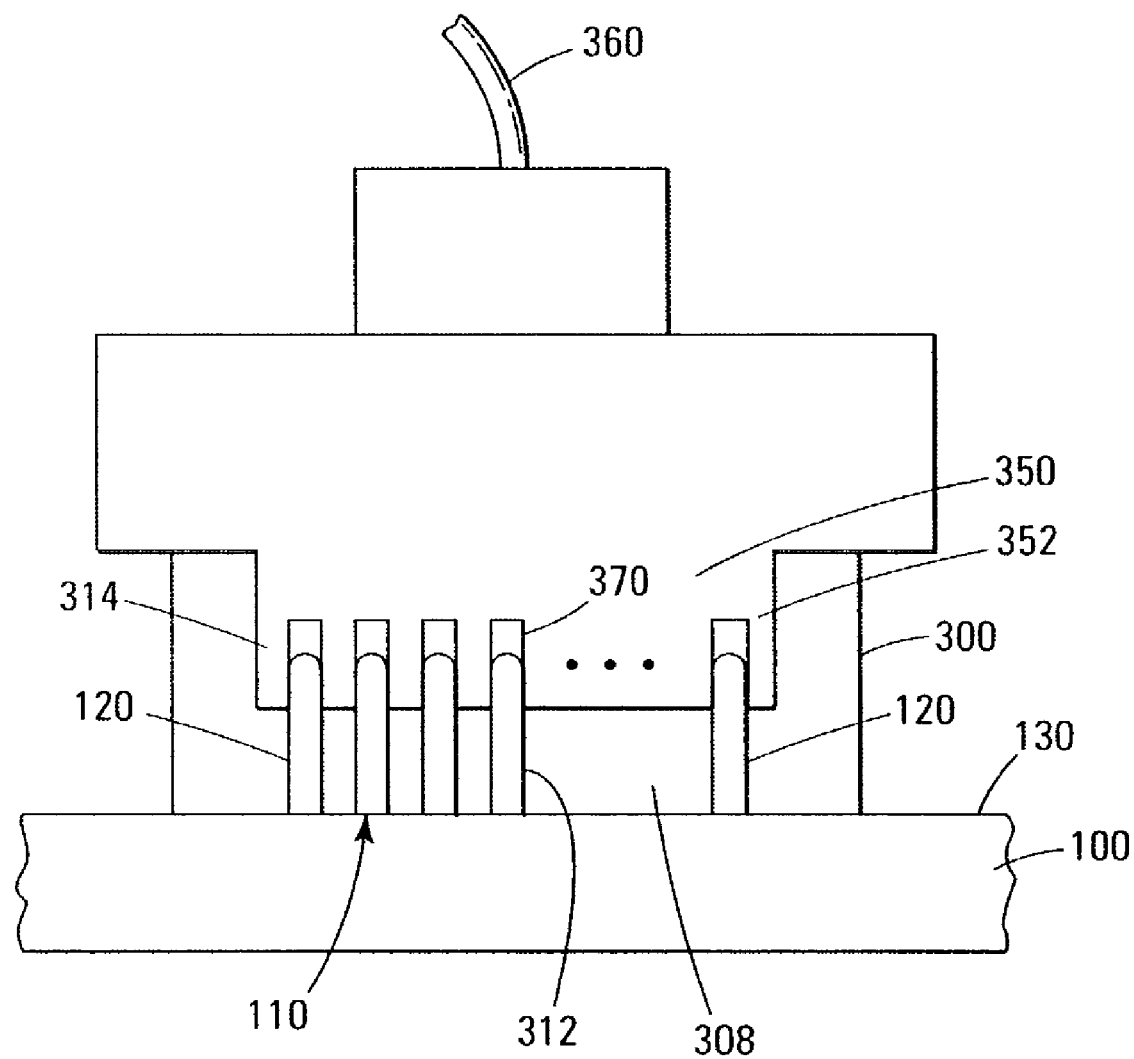
Figure 5:
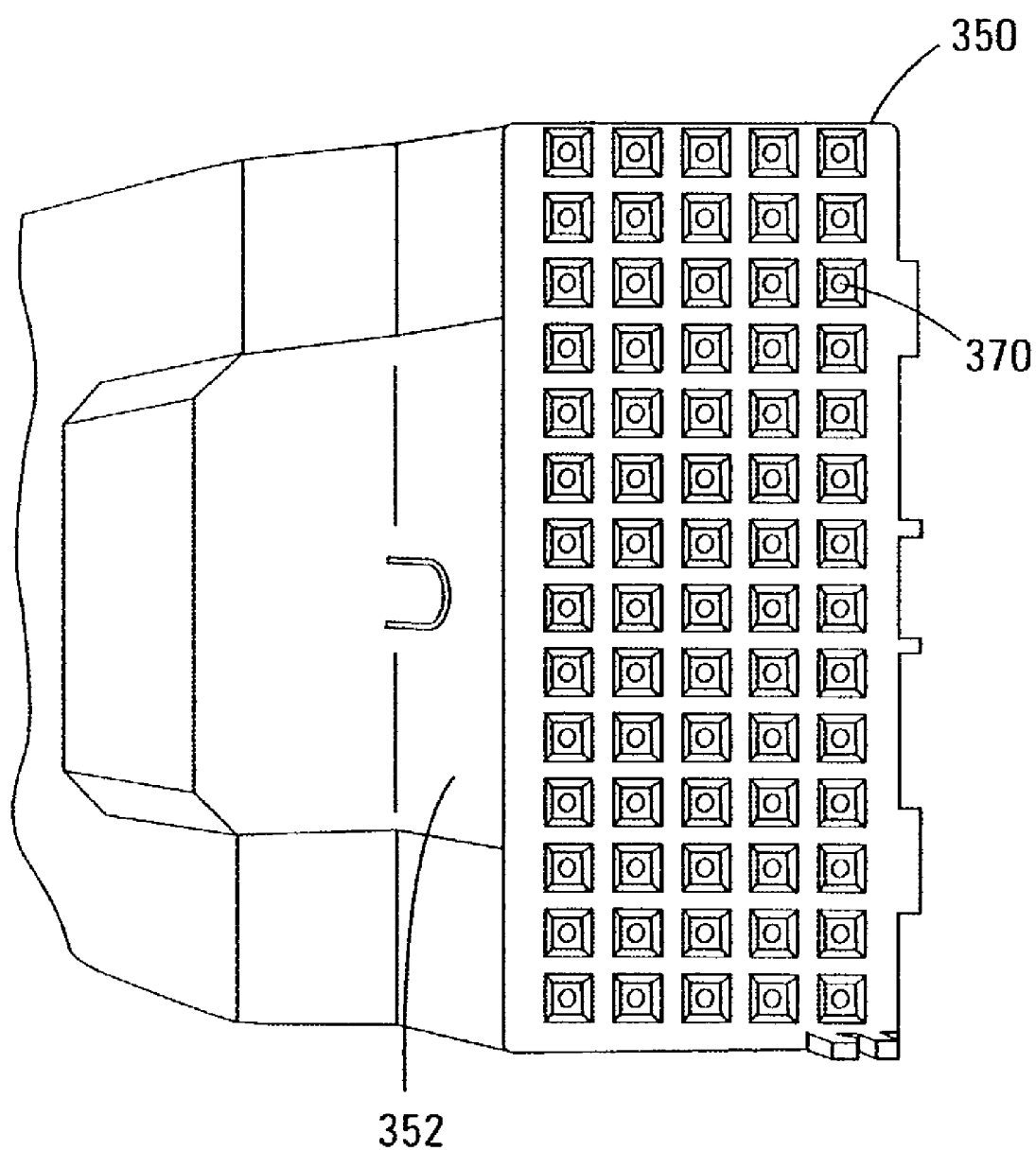
FIG. 5 illustrates an end of the cable connector of FIGS. 3 and 4.

In some embodiments, a shroud 300, as shown in FIGS. 3 and 4, is disposed around pin set 110, e.g., shroud 300 is pressed onto pins 120 so as to surround pin set 110. For one embodiment, shroud has a base 308 having plurality of holes 312 passing therethrough so that when the shroud is pressed onto pins 120, each of pins 120 respectively passes through one of holes 312 of shroud 300 and extends into a cavity 314 of shroud 300. Shroud 300 helps to align and/or orient a cable connector 350 (or female pin connector) that is electrically connected to a cable 360. Cable connector 350 is received in cavity 314 of shroud 300 and each of pin-receiving sockets 370 (shown in FIGS. 4 and 5) of connector 350 respectively receives one of pins 120, as shown in FIG. 4. This electrically connects pin set 110 to connector 350 and thus cable 360. More specifically, a portion 352 of cable connector 350 extends into cavity 314 and engages surfaces thereof, as shown in FIG. 4. One problem with this is that pins 120 do not always properly align with pin-receiving sockets 370 of cable connector 350, e.g., because one or more pins are bent. Improper alignment can damage the pin-receiving sockets 370 of connector 350.

In other embodiments, shroud 300 can be an integral part of a male cable connector that is disposed around a pin set of the pin connector. This connector can be mounted on a circuit board, such as circuit board 300, or can be any standard male cable connector. Therefore, the invention described below is not limited to pin sets disposed on circuit boards.

Figure 6:
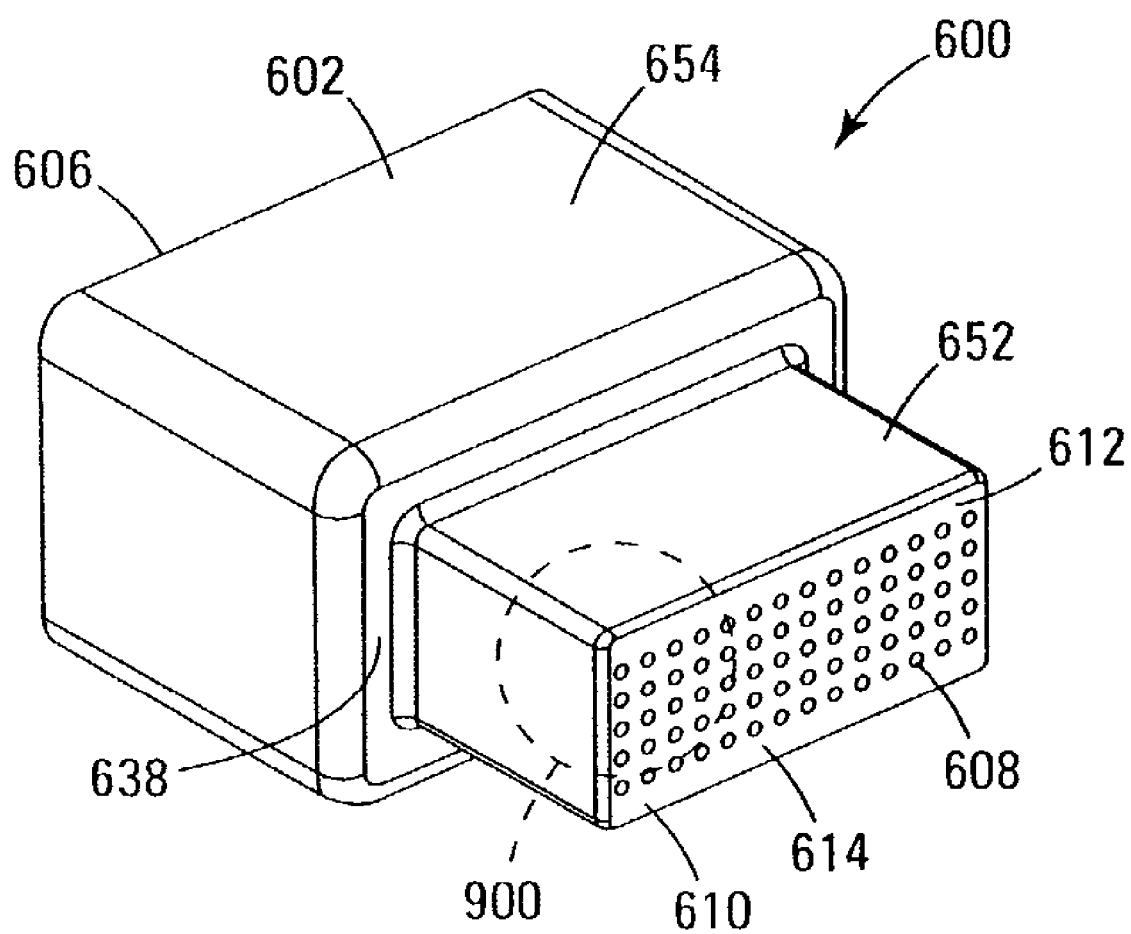
FIGS. 6–8 are respectively front-perspective, back-perspective, and cross-sectional views of an interconnect validation instrument according to an embodiment of the present invention.
Figure 7:
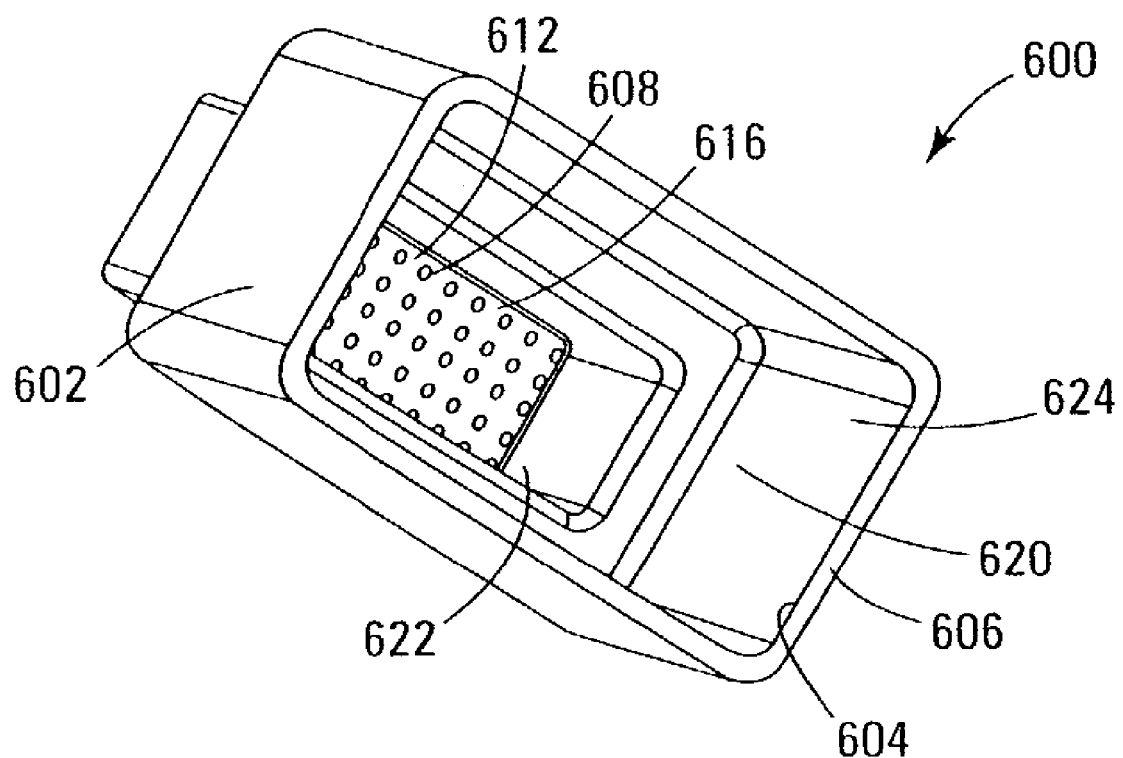
Figure 8:
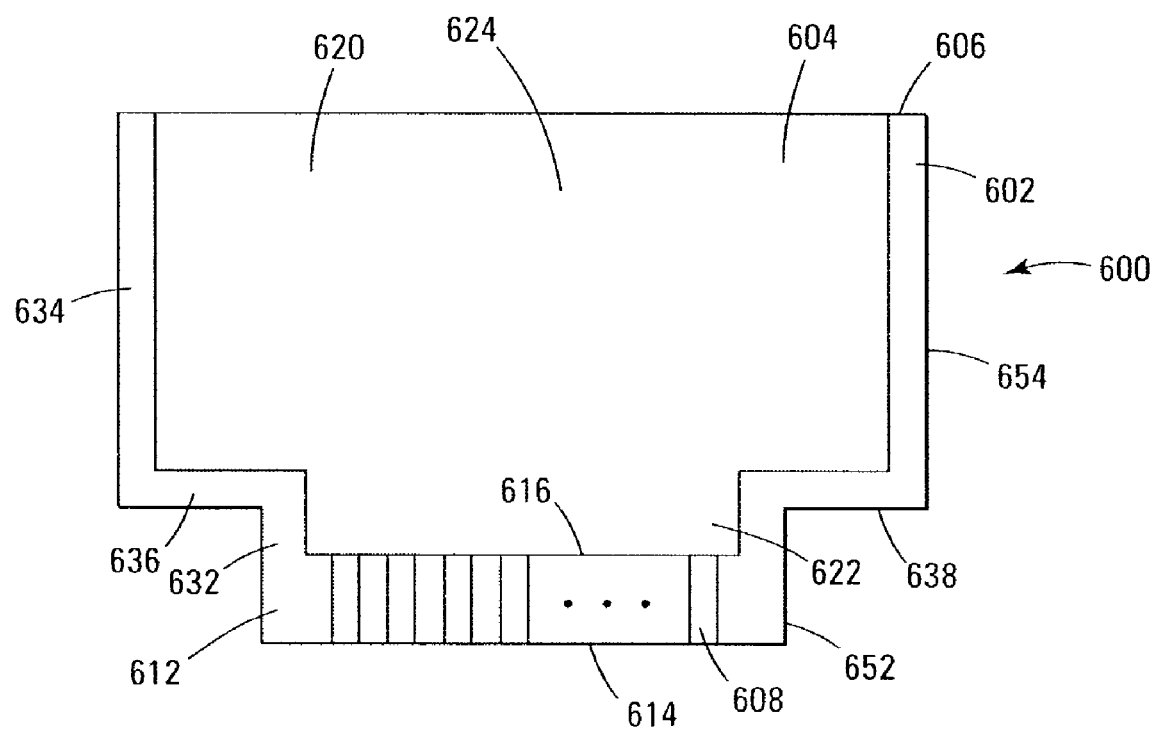

FIGS. 6–8 are respectively front-perspective, back-perspective, and cross-sectional views of an interconnect validation instrument (or a pin alignment tool) 600 according to an embodiment of the present invention. As described in more detail below interconnect validation instrument 600 is used to determine whether pins 120 of pin set 110 are straight and in proper alignment. Interconnect validation instrument 600 can also be used to align pins 120 that are out of alignment.

Interconnect validation instrument 600 has a shell (or a hollow body) 602 with an opening 604 at an end 606 of shell 602. A plurality of holes 608, in one embodiment, pass completely through shell 602 at an end 610 of shell 602 that is opposite end 606. More specifically, for one embodiment, holes 608 pass completely through an end-wall 612 of shell 602 that is opposite and substantially parallel to opening 604. Holes 608 interconnect an exterior surface 614 and an interior surface 616 of end-wall 612. Each of holes 608 is adapted to respectively receive one of pins 120 of pin set 110. Each hole 608 is located on end-wall 612 so as to duplicate the location of a respective one of pin-receiving sockets 370 of cable connector 350.

For one embodiment, an interior 620 of shell 602 includes a chamber 622 that communicates with a chamber 624, as shown in FIGS. 7 and 8. For one embodiment, chamber 622 has a smaller cross-sectional area than chamber 624, where the cross-sectional area is parallel to end-wall 612. FIGS. 7 and 8 also illustrate that end-wall 612 bounds chamber 622 and that holes 608 open into chamber 622. It is further seen that opening 620 provides access to chamber 624. A wall portion 632 of shell 602 bounds chamber 622 and a wall portion 634 of shell 602 bounds chamber 624. A step 636 of shell 602 is connected between wall portions 632 and 634 and has an exterior surface 638 that is substantially parallel to end-wall 612, as shown in FIG. 8. Exterior surface 638 forms part of an exterior portion 654 of shell 602 that bounds chamber 624. Shell 602 also includes an exterior portion 652 that bounds chamber 622 and that protrudes from exterior surface 638 of exterior portion 654, as shown in FIGS. 6 and 8. Exterior portion 652 of shell 602 is connected between exterior surface 638 of exterior portion 654 and end-wall 612. Exterior portion 652 of shell 602 is dimensioned to replicate dimensions of the portion 352 of plug 350 that extends into shroud 300 and thus is dimensioned to fit in cavity 314 of shroud 300 and engage the surfaces of cavity 314.

Figure 9:
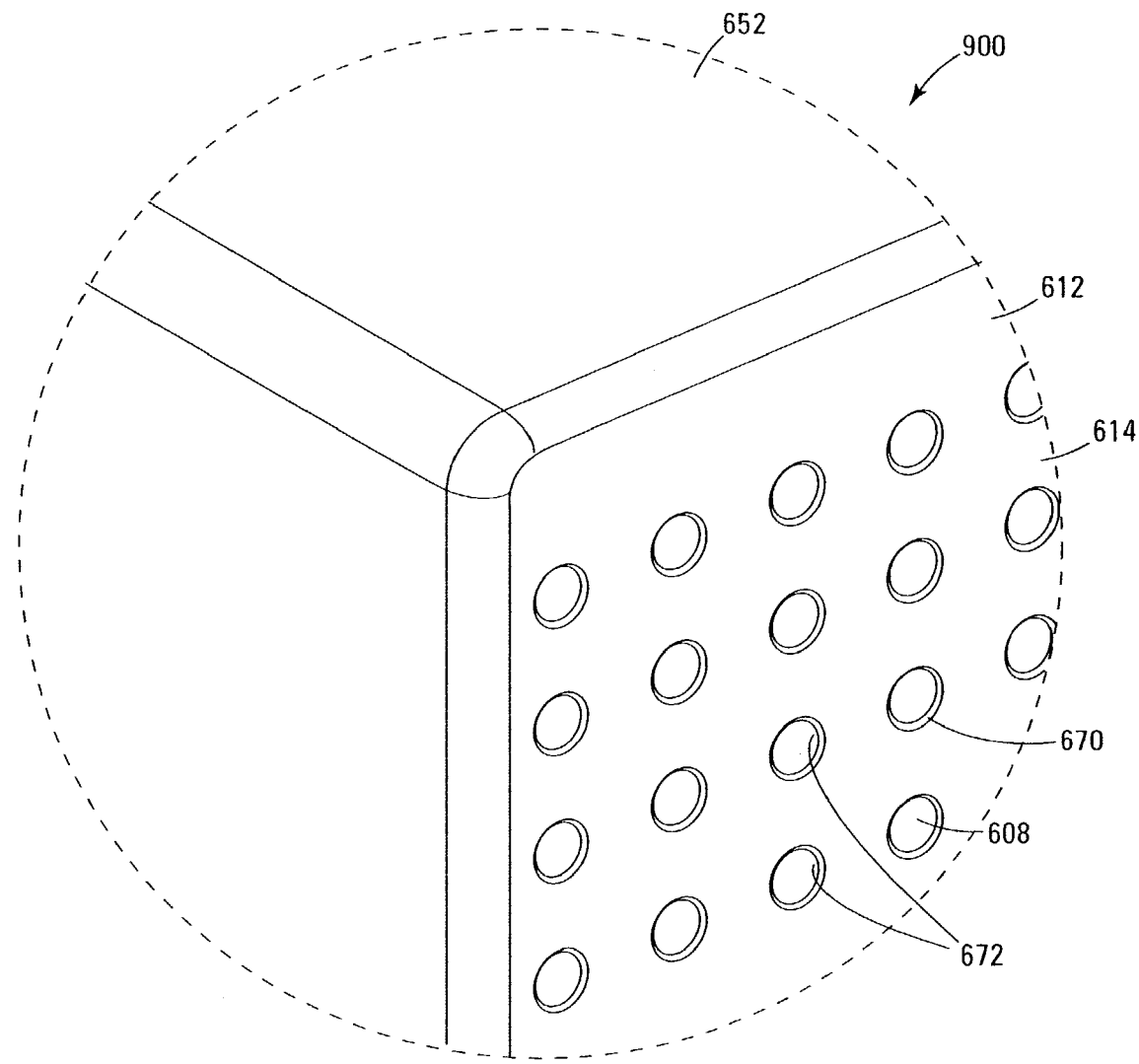
FIG. 9 is an enlarged view of region 900 of FIG. 6.

In one embodiment, a chamber 670 is disposed around each of holes 608 adjacent end 610 of shell 602, as shown in FIG. 9, an enlarged view of region 900 of FIG. 6. The chamber 670 of each of holes 608 is formed in exterior surface 614 of end-wall 612 and extends from exterior surface 614 into the respective hole 608.

For one embodiment, each of holes 608 is formed in end-wall 612 by drilling, electric discharge machining, or the like. For another embodiment, the diameter of each of holes 608 is such that each of holes 608 engages a pin 120 in a press fit. For another embodiment, interconnect validation instrument 600 is fabricated from aluminum that is hardened, e.g., anodized, after holes 608 are formed so as to act to prevent pins 120 from damaging an interior surface 672 (shown in FIG. 9) of each of holes 608 when received therein. For other embodiments, interconnect validation instrument 600 is fabricated from metal that is at least as hard as pins 120, such as stainless steel or the like.

Figure 10:
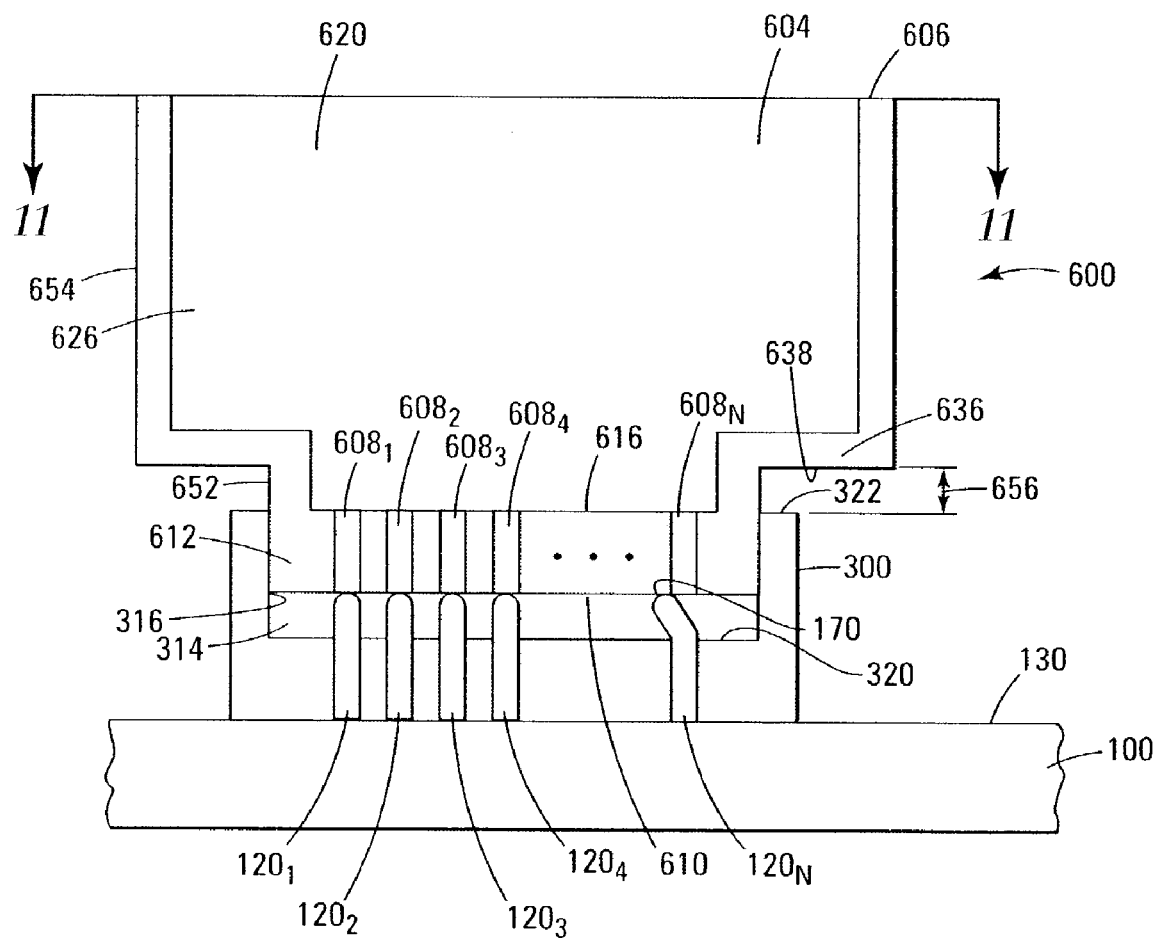
FIG. 10 illustrates an interconnect validation instrument in operation according to an embodiment of the present invention.
Figure 11:
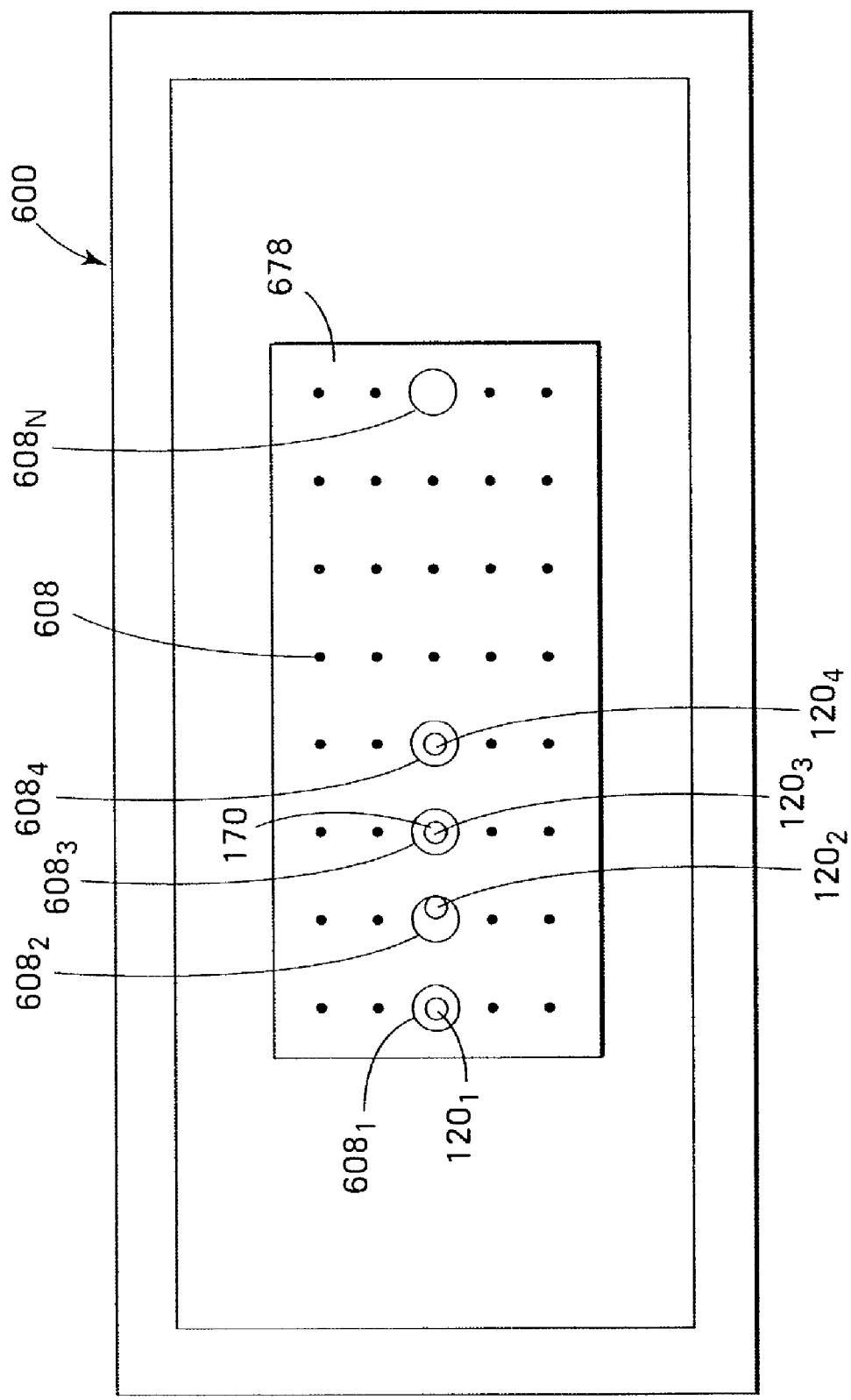
FIG. 11 is a view taken along line 11—11 of FIG. 10.

FIGS. 10 and 11 illustrate interconnect validation instrument 600 in operation according to another embodiment of the invention. In operation, interconnect validation instrument 600 is inserted into shroud 300 and engages an interior surface 316 of shroud 300. More specifically, for one embodiment, exterior portion 652 of shell 602 that protrudes from exterior portion 654 of shell 602 is inserted into cavity 314 of shroud 300 and engages surface 316, as shown in FIG. 10. Before pins 120 are received in holes 608 of interconnect validation instrument 600, a user can observe the alignment of pins 120 through holes 308, as shown in FIG. 11, by looking into interior 620 through opening 604 and observing tips 170 of pins 120.

FIG. 11 demonstrates that pins $120_1$, $120_3$, and $120_4$ are respectively aligned with holes $608_1$, $608_3$, and $608_4$. It is also seen that pin $120_2$ is slightly misaligned with hole $608_2$. As discussed below, pins 120 that are slightly misaligned, such as pin $120_2$ can be aligned using interconnect validation instrument 600. Pin $120_N$ cannot be observed through its respective hole $608_N$. This indicates that pin $120_N$ is too far out of alignment to be repaired using interconnect validation instrument 600. In this case, the misalignment of pin $120_N$ will prevent pin tool from being inserted fully into shroud 300, providing another indication that there is at least one misaligned pin 120 that cannot be repaired using interconnect validation instrument 600. For one embodiment, presence of a gap 656 between exterior surface 638 and an exterior surface 322 surrounding cavity 314, as shown in FIG. 10, when interconnect validation instrument 600 can no longer be inserted into shroud 300 indicates that interconnect validation instrument 600 cannot be fully inserted into shroud 300. This indicates that there is at least one misaligned pin 120 that cannot be repaired using interconnect validation instrument 600. For some embodiments, failure to observe a pin 120 through a corresponding hole 608 can also indicate that the pin 120 is missing.

In situations where a misaligned pin 120 cannot be repaired using interconnect validation instrument 600, interconnect validation instrument 600 is removed from shroud 300 and the misaligned pin 120 is repaired or pin set 110 is replaced. For one embodiment, the misaligned pin 120 is straightened by hand using fingers or a tool such as a screwdriver, knife, or the like, to the point where tip 170 of pin $120_N$ can be observed through hole $608_N$ and can be repaired by interconnect validation instrument 600.

Figure 12:
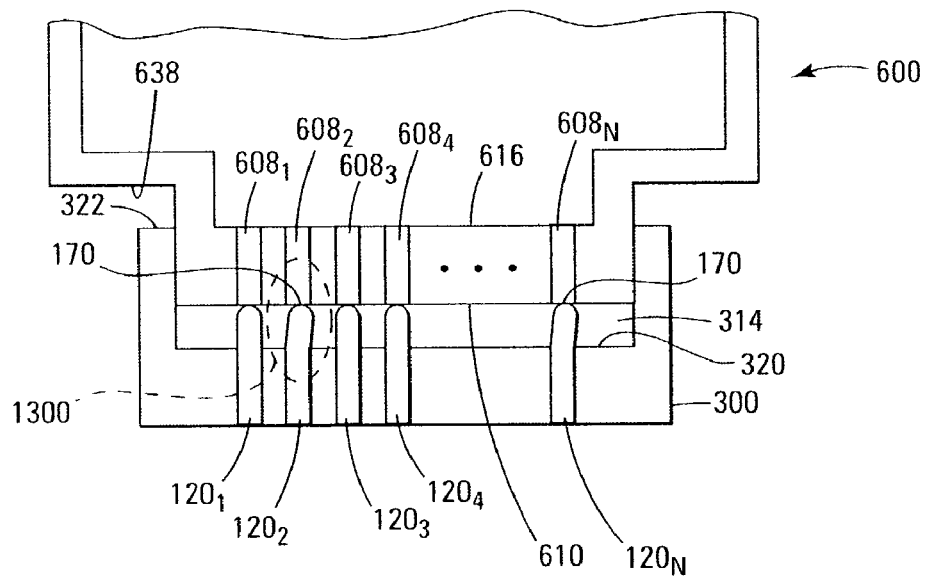
FIG. 12 illustrates an interconnect validation instrument in operation according to another embodiment of the present invention.

FIG. 12 illustrates each of holes 608 respectively receiving one of pins 120 as pin tool is being inserted into cavity 314 of shroud 300 according to an embodiment of the present invention. It is seen that pins $120_1$, $120_3$, and $120_4$ are respectively aligned with holes $608_1$, $608_3$, and $608_4$, as they were in FIGS. 10 and 11, and pin $120_2$ is slightly misaligned with hole $608_2$, as it was in FIGS. 10 and 11. Therefore, tips 170 of these pins are observable through the respective holes 608 from opening 604. Pin $120_N$ is also slightly misaligned with hole $608_N$. For example, pin $120_N$ may have been misaligned with hole $608_N$ so not to be observable through $608_N$, as shown in FIGS. 10 and 11, and then subsequently aligned by hand, as described above, to the point where tip 170 of pin $120_N$ can be observed through hole $608_N$.

Figure 13:
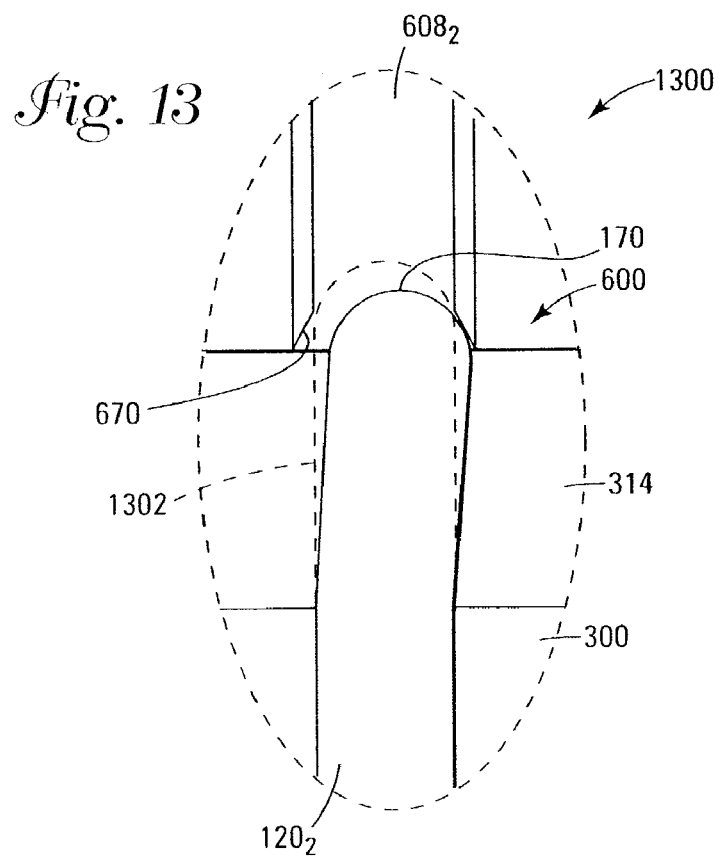
FIG. 13 is an enlarged view if region 1300 of FIG. 12.

FIG. 13 is an enlarged view of region 1300 of FIG. 12 illustrating the repair, e.g., straightening, of misaligned pin $120_2$ by interconnect validation instrument 600. As interconnect validation instrument 600 is inserted into shroud 300 the chamber 670 disposed around hole $608_2$ engages tip 170 of misaligned pin $120_2$, as shown in FIG. 13. Further insertion of tool 600 into shroud 300 causes tip 170 to slide along chamber 670, thereby deflecting pin $120_2$ into hole $608_2$, as illustrated by dashed line 1302 in FIG. 13. This also occurs for pin $120_N$ and any other slightly misaligned pins 120 of pin set 110.

Figure 14:
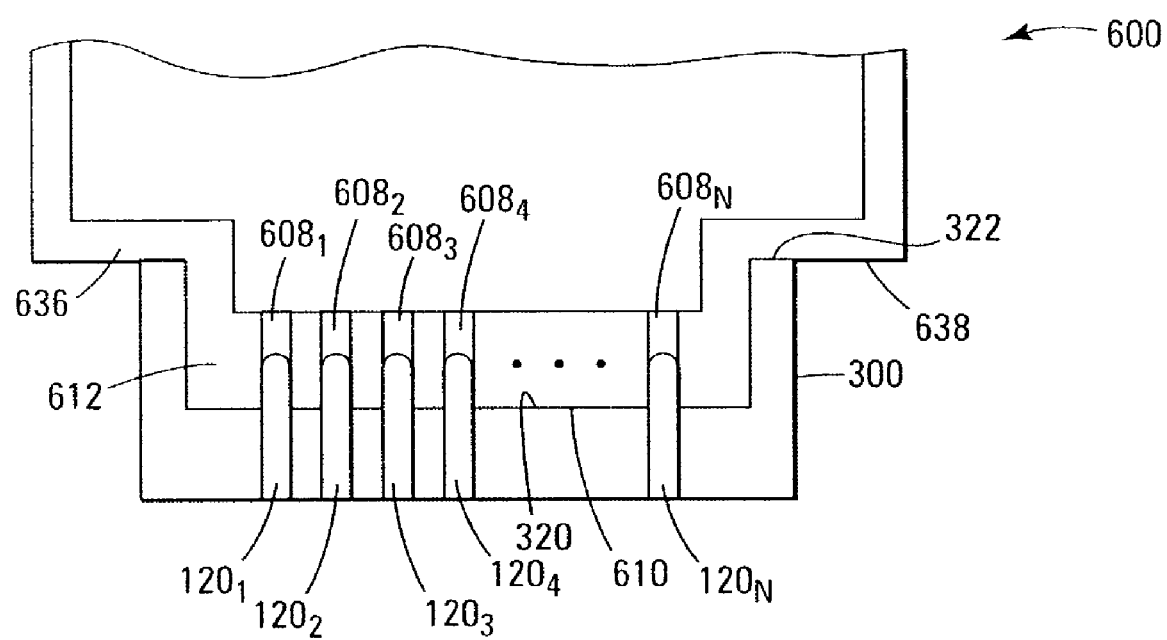
FIG. 14 illustrates an interconnect validation instrument in operation according to another embodiment of the present invention.

Insertion of interconnect validation instrument 600 into shroud 300 continues until tool 600 is fully inserted in shroud 300, as shown in FIG. 14, i.e., until end 610 of interconnect validation instrument 600 abuts bottom 320 of cavity 314. The continued insertion of interconnect validation instrument 600 into shroud 300 straightens pin $120_2$, pin $120_N$ and any other slightly misaligned pins 120 such that when interconnect validation instrument 600 is removed from shroud 300, after full insertion into shroud 300, these pin remain straight enough so as align with corresponding pin-receiving sockets 370 of connector 350 when connector 350 is inserted into shroud 300, as shown in FIG. 4. This acts to prevent damage of pin-receiving sockets 370 due to any misaligned pins 120 and acts to prevent intermittent electrical contact between pin-receiving sockets 370 and any misaligned pins 120. The present invention is not limited to the case where pins 120 do not extend completely through end-wall 612 when interconnect validation instrument 600 is fully inserted in shroud 300, as shown in FIG. 14. Rather, for some embodiments, pins 120 extend completely through end-wall 612 when interconnect validation instrument 600 is fully inserted in shroud 300.

For one embodiment, exterior surface 638 abuts exterior surface 322 surrounding cavity 314 when end 610 of interconnect validation instrument 600 abuts bottom 320 of cavity 314, indicating that interconnect validation instrument 600 is fully inserted in shroud 300. This provides a way to verify that interconnect validation instrument 600 is fully inserted into shroud 300 from the exterior of interconnect validation instrument 600, because abutment of end 610 against bottom 320 cannot be observed from the exterior of interconnect validation instrument 600.

Interconnect validation instrument 600 can be used after pin set 110 and shroud 300 are installed on circuit board 100 during the manufacture of circuit board 100 to verify alignment of pins 120 or to repair any misaligned pins 120. Interconnect validation instrument 600 can also be used during installation of circuit board 100, e.g., in a computer system, such as a network server, to verify alignment of pins 120 or to repair any misaligned pins 120 prior to inserting cable connector 350 into shroud 300 to effect cable connections between various pin sets of the computer system.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. An interconnect validation instrument comprising:
   a shell having an opening at a first end thereof and a second end opposite the first end, the second end having a plurality of holes;
   wherein each of the plurality of holes is adapted to receive a respective one of a plurality of pins therein;
   wherein each of the plurality of holes is further adapted to align the respective one of the plurality of pins when received therein when the respective one of the plurality of pins is not aligned; and
   wherein the plurality of pins are fixed to a structure that is separate from the shell.

2. The interconnect validation instrument of claim 1, wherein each of the plurality of holes passes completely through the shell.

3. The interconnect validation instrument of claim 1, wherein the opening provides for visually observing alignment of the plurality of pins through the plurality of holes.

4. The interconnect validation instrument of claim 1, wherein a chamfer is disposed around each of the plurality of holes.

5. The interconnect validation instrument of claim 1, wherein the shell comprises a first exterior portion protruding from a second exterior portion thereof, the first exterior portion including the second end, the first exterior portion receivable in a shroud containing the plurality of pins.

6. The interconnect validation instrument of claim 5, wherein the first exterior portion bounds a first chamber within an interior of the shell such that the plurality of holes open into the second chamber, wherein the second exterior portion bounds a second chamber within the interior of the shell, the second chamber communicating the first chamber, the opening providing access to the first chamber and thus the second chanter.

7. The interconnect validation instrument of claim 1, wherein the shell comprises a step tat is substantially perpendicular to the second end, wherein the step is adapted to abut a shroud disposed round the plurality of pins when the interconnect validation instrument is fully inserted in the shroud, whereby providing a visual indication that the interconnect validation instrument is fully inserted in the shroud.

8. An interconnect validation instrument comprising:
- an end-wall at a first end of the interconnect validation instrument;
- a plurality of holes passing completely through the end-wall; and
- an opening at a second end of the pin tool that is opposite the first end, the opening being substantially parallel to the end-wall, the opening enabling observation of the plurality of holes through an interior of the interconnect validation instrument;
- wherein each of the plurality of holes is adapted to receive a respective one of a plurality of pins therein; and
- wherein each of the plurality of holes is further adapted to align the respective one of the plurality of pins when received therein when the respective one of the plurality of pins is not aligned.

9. The interconnect validation instrument of claim 8, wherein the opening provides for visually observing alignment of the plurality of pins through the plurality of holes.

10. The interconnect validation instrument of claim 8, wherein a chamfer is disposed around each of the plurality of holes.

11. An interconnect validation instrument comprising:
- a first chamber bounded by a first wall of the interconnect validation instrument and having an opening substantially perpendicular to the first wall, wherein the opening is located at a first end of the interconnect validation instrument; and
- a second chamber communicating with the first chamber, the second chamber bounded by a second wall of the interconnect validation instrument and a third wall of the interconnect validation instrument, the third wall substantially parallel to the opening and substantially perpendicular to the second wall, the third wall forming a second end of the interconnect validation instrument that is opposite the first end, the third wall having a plurality of holes passing completely therethrough;
- wherein each of the plurality of holes is adapted to receive a respective one of a plurality of pins therein; and
- wherein each of the plurality of holes is further adapted to align the respective one of the plurality of pins when received therein when the respective one of the plurality of pins is not aligned.

12. The interconnect validation instrument of claim 11, wherein the opening provides for visually observing alignment of the plurality of pins through the plurality of holes via the first and second chambers.

13. The interconnect validation instrument of claim 11, wherein a chamfer is disposed around each of the plurality of holes.

14. The interconnect validation instrument of claim 11, wherein a step is connected between the first and second walls and is substantially perpendicular to the first and second walls and substantially parallel to the third wall.

15. The interconnect validation instrument of claim 14, wherein the step is adapted to abut a shroud disposed around the plurality of pins when the interconnect validation instrument is fully inserted in the shroud, whereby providing a visual indication that the interconnect validation instrument is fully inserted in the shroud.

16. An interconnect validation instrument, comprising:
- means for determining whether any misaligned pins of a plurality of pins can be aligned by the interconnect validation instrument;
- means for receiving the plurality of pins; and
- means for directing the misaligned pins that can be aligned by the interconnect validation instrument into the pin receiving means, wherein the pin receiving means aligns the misaligned pins;
- wherein the plurality of pins are fixed to a structure that is separate from the interconnect validation instrument.

17. The interconnect validation instrument of claim 16, wherein the means for determining whether any misaligned pins of a plurality of pins can be aligned by the interconnect validation instrument comprises a means for observing the plurality of pins through the pin receiving means.

18. The interconnect validation instrument of claim 16, wherein the means for determining whether any misaligned pins of a plurality of pins can be aligned by the interconnect validation instrument comprises a means for determining whether the interconnect validation instrument can be fully inserted into a shroud containing the plurality of pins.

19. The interconnect validation instrument of claim 16, wherein the means for directing the misaligned pins comprises means for deflecting the misaligned pins that can be aligned by the interconnect validation instrument into the pin receiving means.

* * * * *

UNITED STATES PATENT AND TRADEMARK OFFICE
CERTIFICATE OF CORRECTION

| | | |
|---|---|---|
| PATENT NO. | : 7,100,273 B2 | Page 1 of 1 |
| APPLICATION NO. | : 10/378241 | |
| DATED | : September 5, 2006 | |
| INVENTOR(S) | : William Dale Youngman et al. | |

It is certified that error appears in the above-identified patent and that said Letters Patent is hereby corrected as shown below:

In column 6, line 59, in Claim 6, delete "chanter" and insert -- chamber --, therefor.

In column 6, line 61, in Claim 7, delete "tat" and insert -- that --, therefor.

In column 6, line 63, in Claim 7, delete "round" and insert -- around --, therefor.

In column 7, line 23, in Claim 11, after "instrument" insert -- , --.

In column 7, line 38, in Claim 11, delete "boles" and insert -- holes --, therefor.

Signed and Sealed this

Twelfth Day of January, 2010

David J. Kappos
*Director of the United States Patent and Trademark Office*